(12) United States Patent
Darwish et al.

(10) Patent No.: US 6,295,220 B1
(45) Date of Patent: *Sep. 25, 2001

(54) MEMORY BAR AND RELATED CIRCUITS AND METHODS

(75) Inventors: Rashwan B. Darwish, Irvine; Trung Huynh, Santa Ana, both of CA (US)

(73) Assignee: Zomaya Group, Inc., Irvine, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/185,276

(22) Filed: Nov. 3, 1998

(51) Int. Cl.[7] ....................................... G11C 5/02
(52) U.S. Cl. .................. 365/52; 365/51; 365/54
(58) Field of Search .................. 365/52, 51, 63, 365/54; 361/417, 773; 257/777, 723

(56) References Cited

U.S. PATENT DOCUMENTS

| 3,184,649 | 5/1965 | Singletary | 317/101 |
| 3,267,334 | 8/1966 | Wuk | 317/101 |

(List continued on next page.)

FOREIGN PATENT DOCUMENTS

| 04-209562 | 7/1992 | (JP) . |
| 6-77644 | 3/1994 | (JP) . |

Primary Examiner—David Nelms
Assistant Examiner—David Lam
(74) Attorney, Agent, or Firm—Lyon & Lyon LLP (57) ABSTRACT

A memory bar for use in high density memory modules. A memory bar comprises a substrate that provides a mounting for at least two IC chips, such that the substrate and associated IC chips may be mounted, for example, on one side of a memory module.

7 Claims, 7 Drawing Sheets

U.S. PATENT DOCUMENTS

| | | | |
|---|---|---|---|
| 3,340,439 | 9/1967 | Henschen et al. | 317/101 |
| 3,372,308 | 3/1968 | Noschese et al. | 317/101 |
| 3,495,134 | 2/1970 | Collins et al. | 317/101 |
| 4,137,559 | 1/1979 | Reuting | 361/331 |
| 4,371,912 * | 2/1983 | Guzik | 361/417 |
| 4,688,864 | 8/1987 | Sorel | 439/74 |
| 4,770,640 | 9/1988 | Walter | 439/69 |
| 4,956,694 | 9/1990 | Elde | 357/74 |
| 4,956,746 | 9/1990 | Gates et al. | 361/385 |
| 4,996,587 | 2/1991 | Hinrichsmeyer et al. | 357/74 |
| 5,028,986 | 7/1991 | Sugano et al. | 357/75 |
| 5,128,831 | 7/1992 | Fox et al. | 361/396 |
| 5,198,888 | 3/1993 | Sugano et al. | 257/686 |
| 5,241,454 | 8/1993 | Ameen et al. | 361/744 |
| 5,266,912 | 11/1993 | Kledzik | 333/247 |
| 5,343,075 | 8/1994 | Nishino | 257/686 |
| 5,343,366 | 8/1994 | Cipolla et al. | 361/785 |
| 5,371,654 | 12/1994 | Beaman et al. | 361/744 |
| 5,373,189 | 12/1994 | Massit et al. | 257/686 |
| 5,394,303 | 2/1995 | Yamaji | 361/749 |
| 5,397,747 | 3/1995 | Angiulli et al. | 437/209 |
| 5,397,916 | 3/1995 | Normington | 257/686 |
| 5,434,745 | 7/1995 | Shokrgozar | 361/735 |
| 5,440,181 | 8/1995 | Gruender et al. | 307/156 |
| 5,450,289 * | 9/1995 | Kweon et al. | 361/773 |
| 5,455,740 | 10/1995 | Burns | 361/735 |
| 5,481,134 | 1/1996 | Sobhani et al. | 257/686 |
| 5,491,304 | 2/1996 | Lau et al. | 174/264 |
| 5,493,476 | 2/1996 | Burns | 361/735 |
| 5,514,907 | 5/1996 | Moshayedi | 257/723 |
| 5,579,207 | 11/1996 | Hayden et al. | 361/790 |
| 5,581,498 | 12/1996 | Ludwig et al. | 365/63 |
| 5,594,275 | 1/1997 | Kwon et al. | 257/686 |
| 5,600,541 | 2/1997 | Bone et al. | 361/707 |
| 5,608,265 | 3/1997 | Kitano et al. | 257/738 |
| 5,625,221 | 4/1997 | Kim et al. | 257/686 |
| 5,656,856 | 8/1997 | Kweon | 257/686 |
| 5,677,569 | 10/1997 | Choi et al. | 257/686 |
| 5,699,234 | 12/1997 | Saia et al. | 361/790 |
| 5,701,233 | 12/1997 | Carson et al. | 361/735 |
| 5,723,903 | 3/1998 | Masuda et al. | 257/696 |
| 5,744,827 | 4/1998 | Jeong et al. | 257/686 |
| 5,781,415 | 7/1998 | Itoh | 361/790 |
| 5,783,870 | 7/1998 | Mostafazadeh | 257/791 |
| 5,804,872 | 9/1998 | Miyano et al. | 257/668 |
| 5,811,877 | 9/1998 | Miyano et al. | 257/706 |
| 5,811,879 * | 9/1998 | Akram | 257/723 |
| 5,818,107 | 10/1998 | Pierson et al. | 257/723 |
| 5,835,988 | 11/1998 | Ishii | 257/684 |
| 5,838,061 | 11/1998 | Kim | 257/686 |
| 5,841,686 * | 11/1998 | Chu et al. | 365/51 |
| 5,861,666 | 1/1999 | Bellaar | 257/686 |
| 5,883,426 | 3/1999 | Tokuno et al. | 257/686 |
| 5,977,640 * | 11/2000 | Bertin et al. | 257/777 |

* cited by examiner

COMPONENT SIDE

FIG. 6B SOLDER SIDE

MEMORY BAR AND RELATED CIRCUITS AND METHODS

BACKGROUND OF THE INVENTION

The present invention relates generally to memory devices and, more particularly, to a memory bar for use in expanding the capacity of, for example, a high density multichip module (MCM).

For the past several years, substantial attention has been directed to the field of memory modules including, for example, single inline memory modules (SIMMs) and dual inline memory modules (DIMMs). Such modules are useful, for example, in expanding the memory of a personal computer or other computing system, and the market for such modules is extremely competitive. In short, there is intense pressure within the memory module market to provide modules with increased capacity for less cost.

In view of the competitiveness of the memory module market, it is believed that those skilled in the art would find systems and methods for expanding the capacity of memory modules to be quite useful.

SUMMARY OF THE INVENTION

In one innovative aspect, the present invention is directed to a memory bar that may be used to dramatically increase the capacity of a high density multichip memory module. In one presently preferred embodiment, the memory bar provides a means for integrating numerous sets of identical dynamic random access memory (DRAM) integrated circuit packages by sandwiching the memory bar between respective pairs of packages. Moreover, by using a memory bar in accordance with the present invention, it is possible to literally double the memory capacity of conventional high density multichip modules such as DIMMs and SIMMs. The reason for this is that the use of a memory bar in accordance with the present invention allows for twice the number of memory chips to be mounted upon each side of a memory module.

A memory bar in accordance with the present invention may be viewed as a multichip carrier device. For example, the memory bar may comprise a printed circuit board structure having a plurality of land patterns provided on an upper surface and a lower surface thereof. The land patterns provided on the upper surface of the memory bar provide contacts for a first IC package, and the land patterns on the bottom surface of the memory bar provide contacts for a second IC package. In a preferred form, a gap of about 10 mils is provided between the top memory package and the bottom memory package. Such a gap allows for improved thermal dissipation by the resulting multi-chip memory structure. Once the IC chips are affixed to the memory bar, the memory bar may be mounted on, for example, one side of a dual inline memory module (DIMM), thus greatly increasing the amount of memory that is conventionally provided on one side of such a module. Of course, a similar memory bar structure may be used to increase the memory capacity on an opposite side of the dual inline memory module.

Accordingly, it is an object of the present invention to provide a memory bar for expanding the memory capacity of high density memory modules.

It also is an object of the present invention to provide an innovative memory bar structure that is useful during the assembly of high density memory modules.

Other objects and features of the present invention will become apparent from consideration of the following description taken in conjunction with the accompanying drawings.

DETAILED DESCRIPTION OF PREFERRED EMBODIMENTS

Figures 1, 2A, 2B, 3:
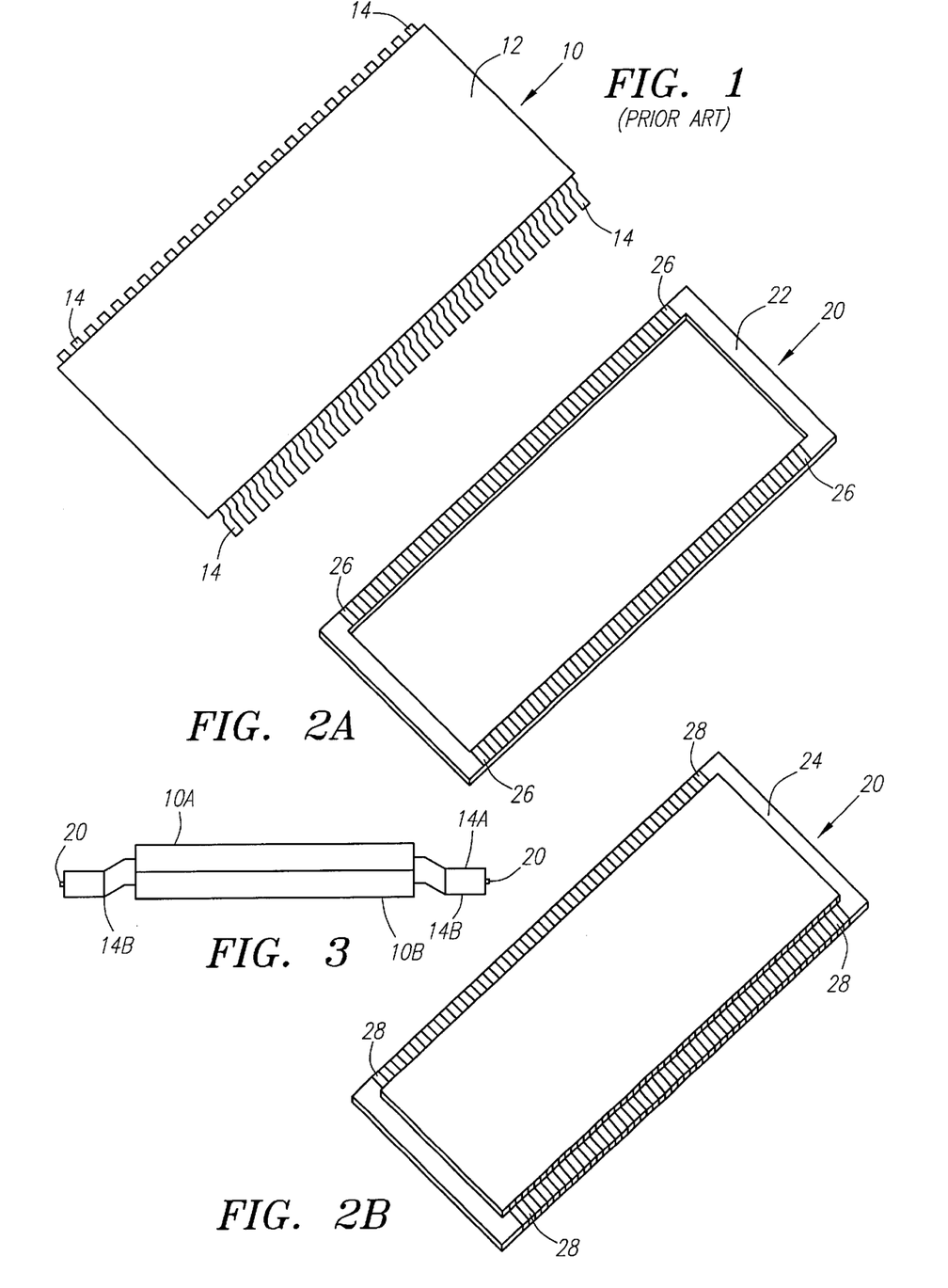
FIG. 1 is a plan view of a conventional integrated circuit memory package.
FIG. 2A is a plan view of a top surface of memory bar in accordance with a preferred embodiment of the present invention.
FIG. 2B is a plan view of a bottom surface of memory bar in accordance with a preferred embodiment of the present invention.
FIG. 3 is a cross-sectional view illustrating a pair of integrated circuit (IC) packages that are mounted on a memory bar in accordance with the present invention.

Turning now to the drawings, FIG. 1 provides an illustration of a conventional integrated circuit (IC) chip package 10 that may be mounted on a memory bar 20 (shown in FIG. 2) in accordance with the present invention. The IC chip package 10 includes a package body 12 and a plurality of conductive leads 14. The conductive leads 14 are designed, for example, to be bonded by soldering to a plurality of land patterns (not shown) provided on a printed circuit board.

Turning now to FIGS. 2A and 2B, a memory bar 20 in accordance with the present invention has a top surface 22 and a bottom surface 24 whereon a plurality of land patterns 26 and 28 are provided. The land patterns 26 and 28 provide a means for mounting a pair of IC chips 10 on the memory bar 20, as shown in FIG. 3.

Moreover, as shown in FIG. 3, when mounted on a memory bar 20, a pair of IC packages 10a and 10b preferably are arranged or aligned to have the same electrical polarity. Further, in one particularly preferred embodiment, a gap (not shown) of about 10 mils is provided between the top IC package 10a and the bottom IC package l0b. The gap (not shown) is provided to enhance thermal dissipation from the combined memory structure.

Figure 4:
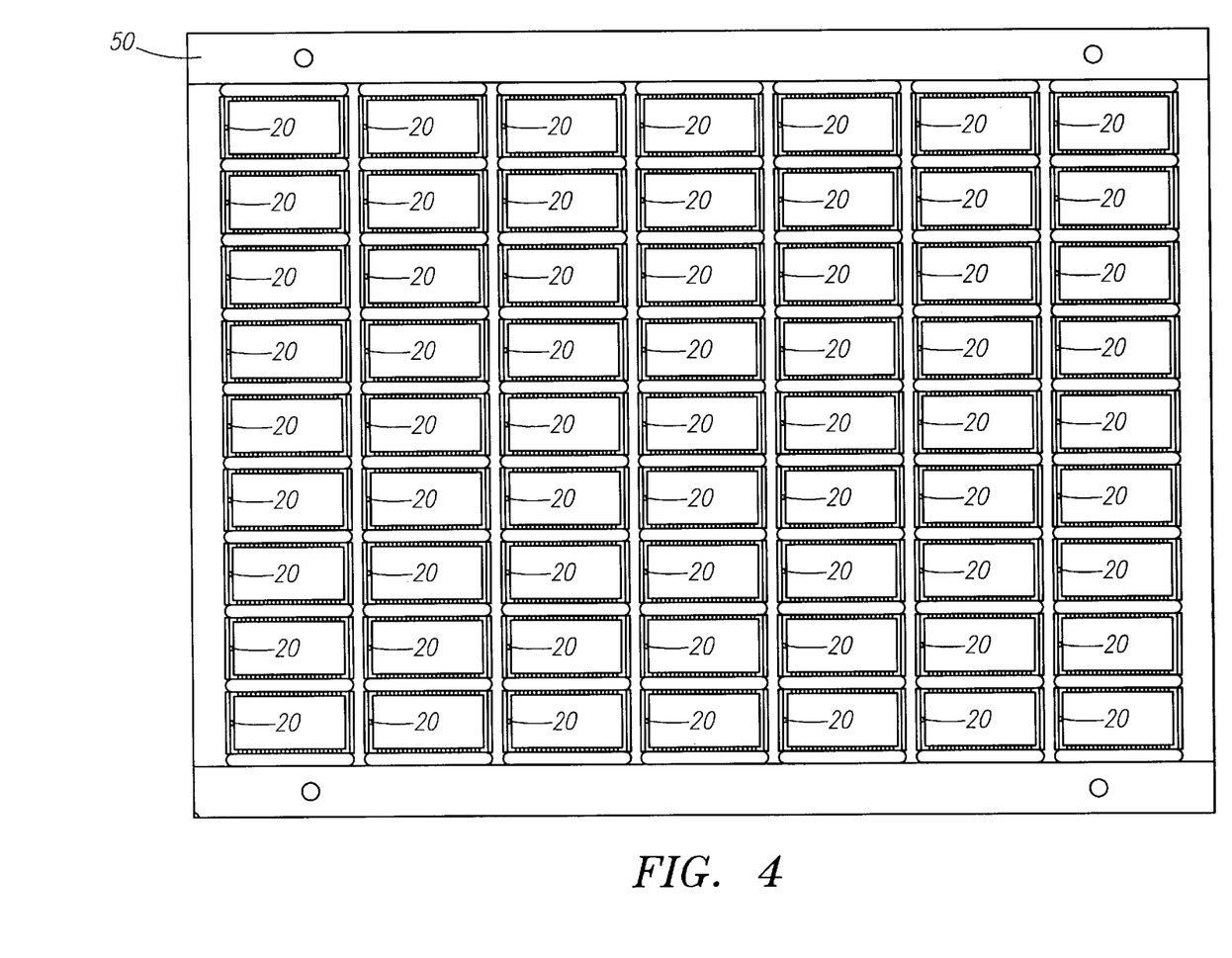
FIG. 4 is a top view of a memory bar substrate comprising 72 memory bar structures.
Figure 5A:
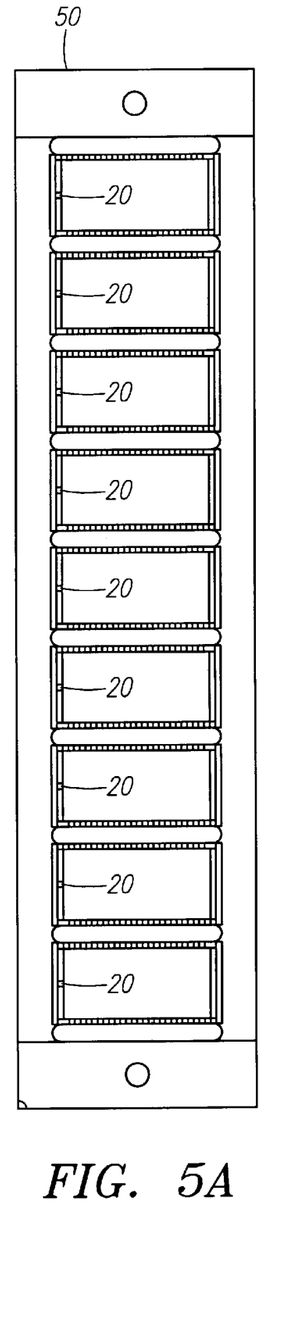
FIG. 5A is an illustration of a component side layer of a memory bar substrate in accordance with the present invention.
Figure 5B:
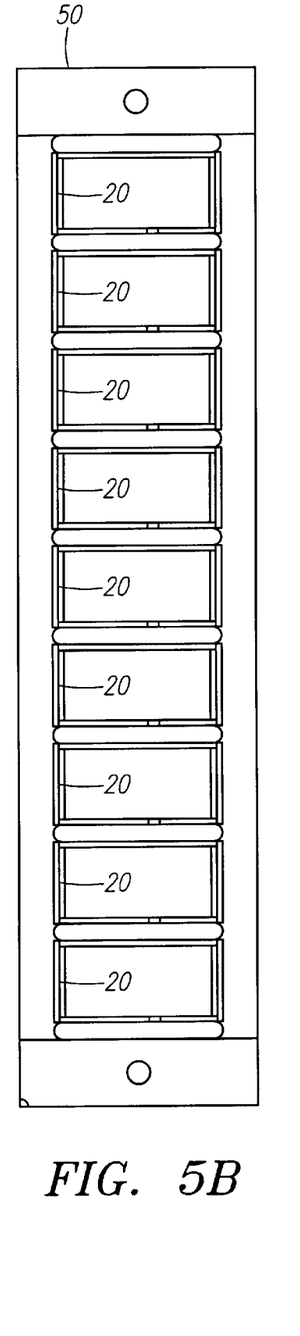
FIG. 5B is an illustration of an intermediate layer of a memory bar substrate in accordance with the present invention.
Figure 5C:
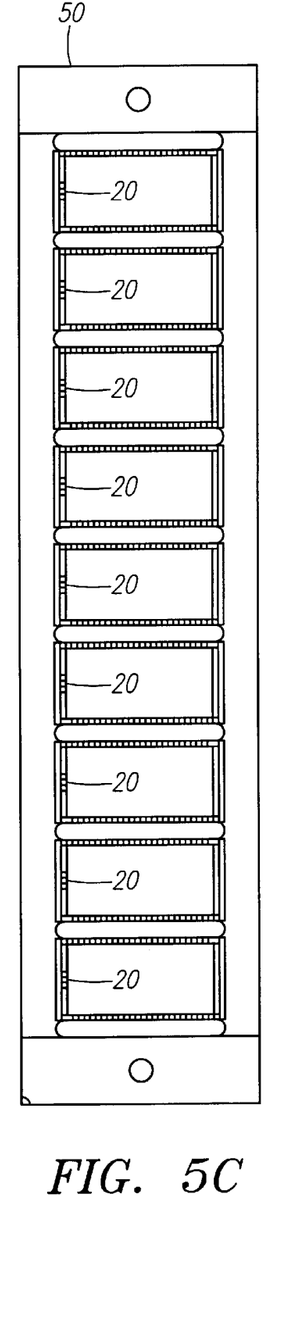
FIG. 5C is an illustration of a solder side layer of a memory bar substrate in accordance with the present invention.
Figure 5D:
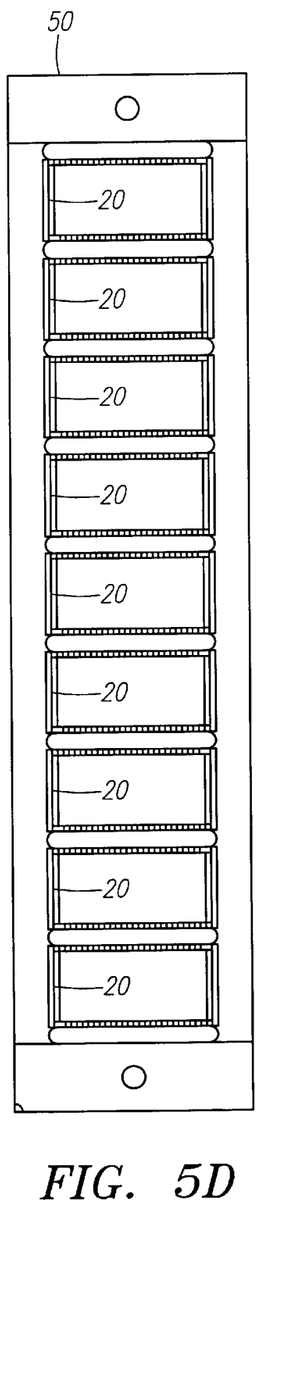
FIG. 5D is an illustration of a top solder mask for a memory bar substrate in accordance with the present invention.
Figure 5E:
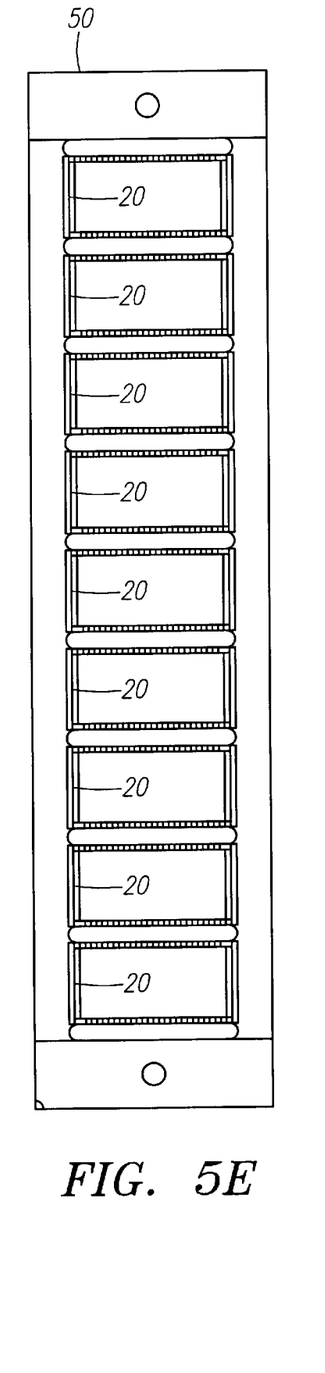
FIG. 5E is an illustration of a bottom solder mask for a memory bar substrate in accordance with the present invention.
Figure 5F:
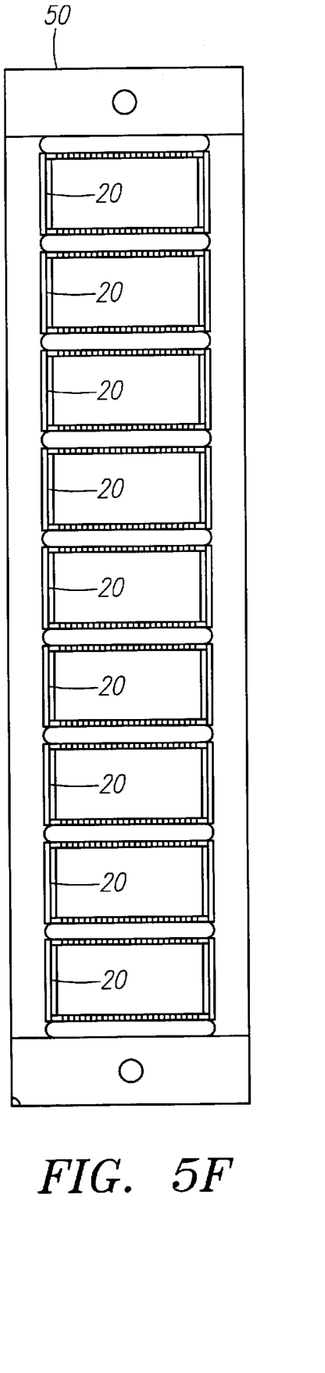
FIG. 5F is an illustration of a top solder paste for a memory bar substrate in accordance with the present invention.
Figure 5G:
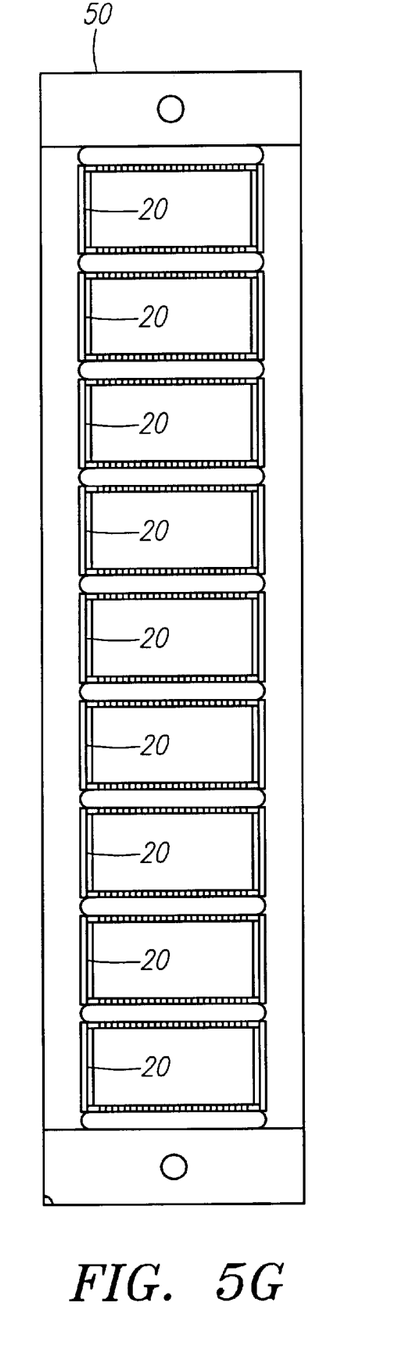
FIG. 5G is an illustration of a bottom solder paste for a memory bar substrate in accordance with the present invention.
Figure 5H:
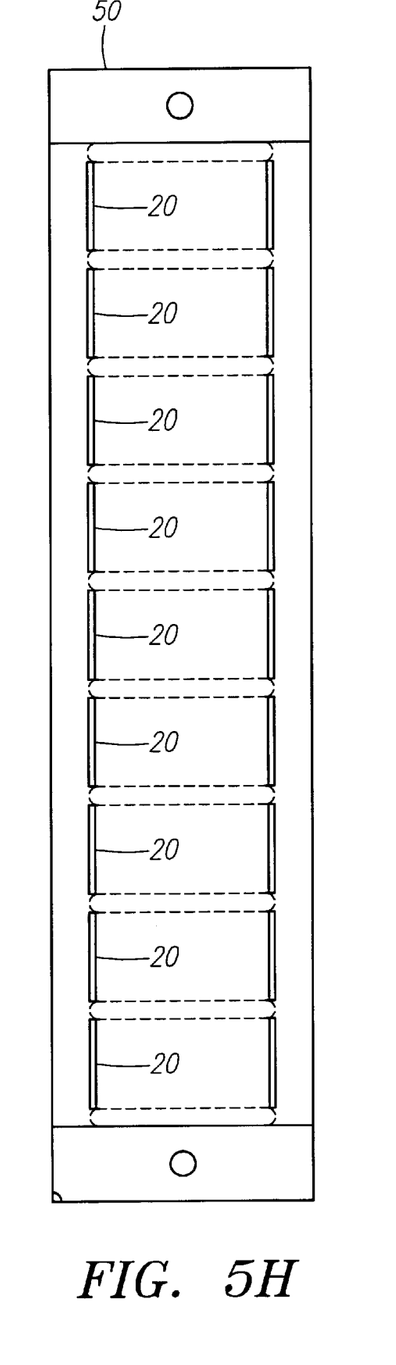
FIG. 5H is a drill drawing for a memory bar substrate in accordance with the present invention.
Figure 6A:
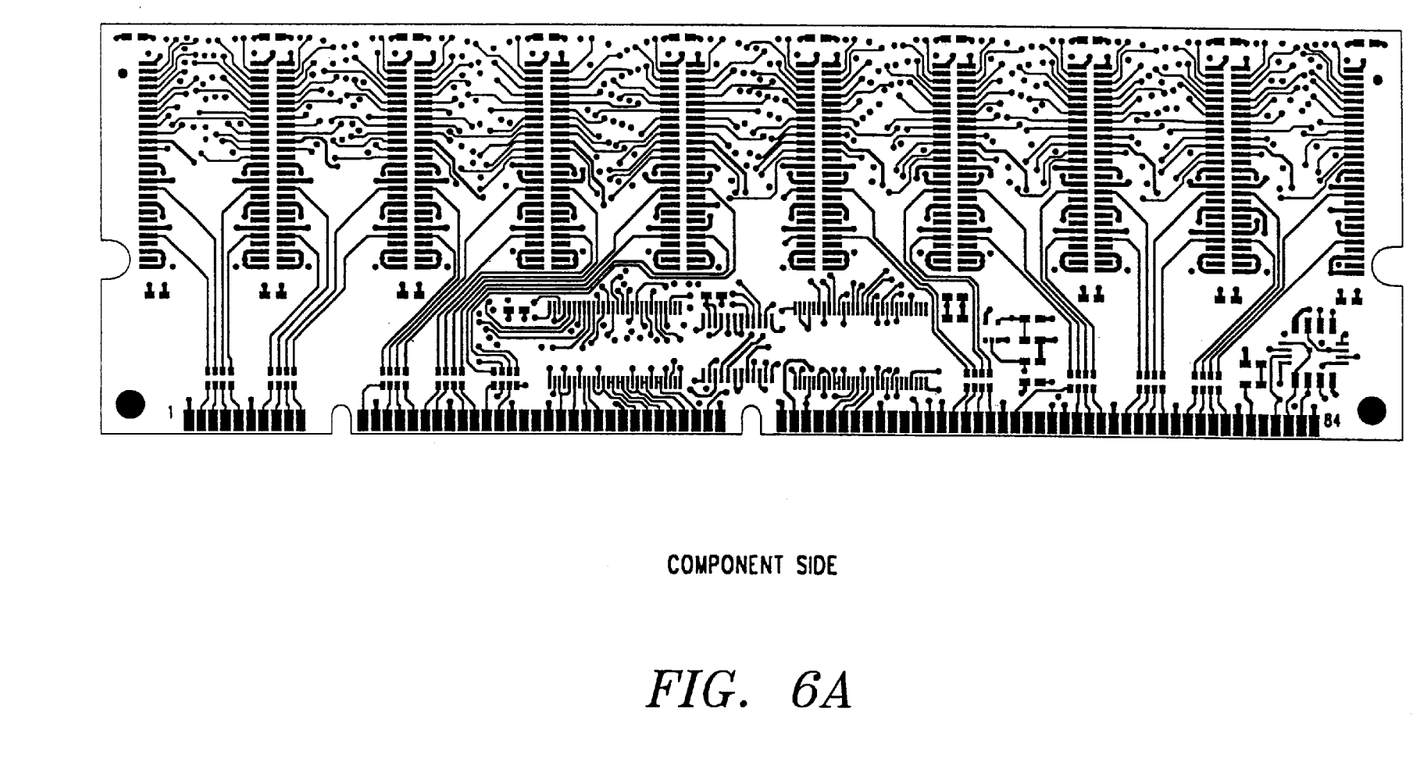
FIG. 6A is an illustration of a component side of a high density multichip module (MCM) that may have mounted thereon a plurality of populated memory bars in accordance with the present invention.
Figure 6B:
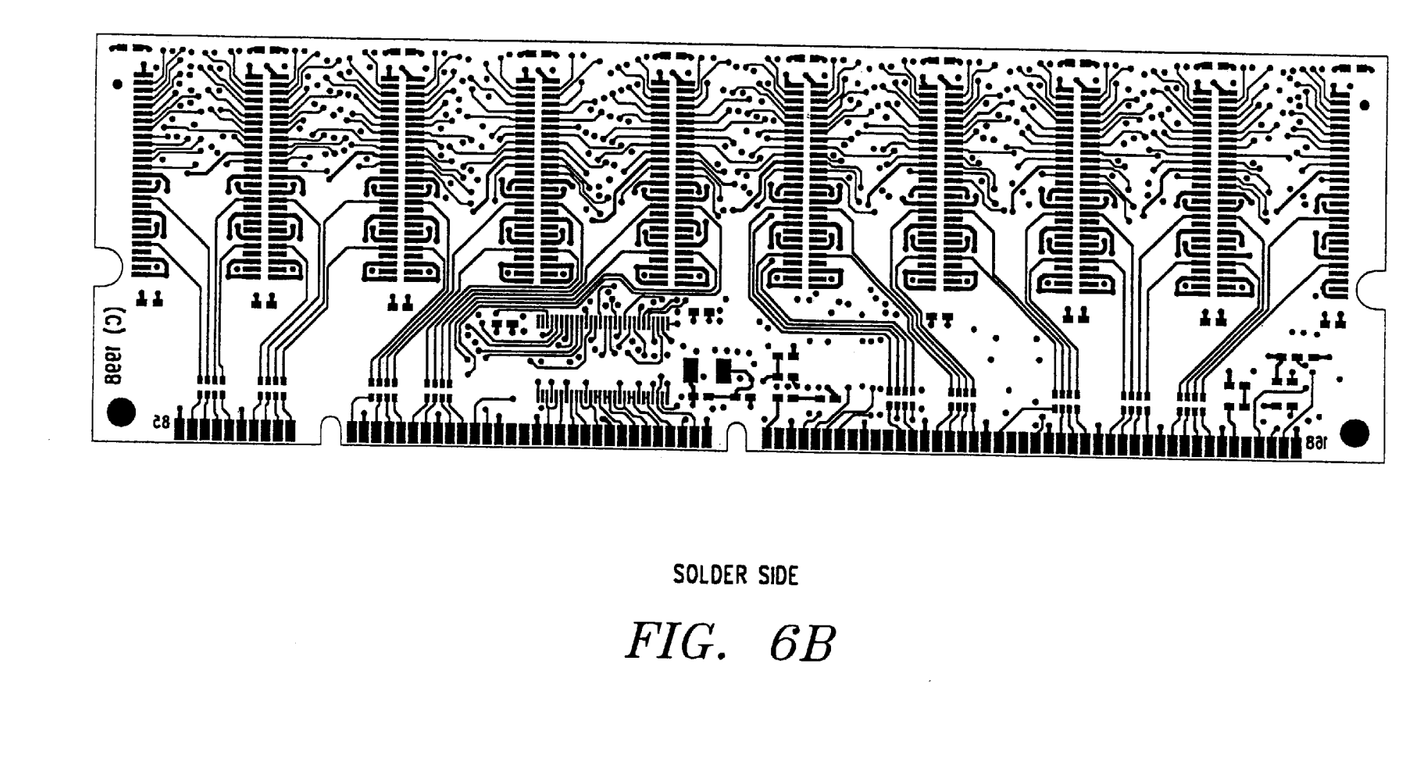
FIG. 6B is an illustration of a solder side of a high density multichip module (MCM) that may have mounted thereon a plurality of populated memory bars in accordance with the present invention.

Turning now to FIG. 4, when assembling memory modules, a memory bar substrate 50 is preferably utilized. The memory bar substrate 50 preferably includes eight rows or sub-groups of memory bar units 20, wherein each sub-group includes, for example, nine memory bars 20 of the type illustrated in FIGS. 2A, 2B and 3. Further, those skilled in the art will appreciate that, when assembling high density memory modules, pairs of integrated circuit chips 10 preferably are mounted on the respective memory bars 20 comprising the substrate 50 prior to disassembly or cleavage of the substrate 50. Moreover, conventional pick-and-place equipment may be easily utilized to populate the memory bar substrate 50 and, thereafter, the substrate 50 may be cut to provide eight groups of populated memory bar subunits for mounting, for example, on a memory module substrate 60, such as that shown in FIGS. 6A and 6B.

FIGS. 5A–5H provide an illustration of the various layers, masks and pastes that are utilized in forming a memory bar substrate 50 in accordance with the present invention. The illustrations of the layers, masks and pastes provided in FIGS. 5A–5H will be readily understood by those skilled in the art. Accordingly, a detailed discussion of the various layers, masks and pastes is not provided herein. However, it should be appreciated that the majority of land patterns 26 and 28 provided, respectively, on the top surface 22 and bottom surface 24 of the memory bar 20 are interconnected by metal traces (not shown) provided within the memory bar 20. Further, chip selection traces (not shown) are provided within each memory bar 20 to allow for selective operation of the IC chips 10a and 10b that are mounted on the memory bar 20.

Those skilled in the art will appreciate that, while the memory bar units 20 described above provide a mounting for only two IC packages, it would be possible in accordance with the present invention to assemble memory bar units capable of accommodating additional IC packages. For example, if it were desired to create a "double bar," a pair of populated memory bar units 20 might be mounted one on top of the other and, thereafter, mounted on a surface of a memory module. In such an embodiment, a resulting memory module might have four times the memory capacity of conventional modules. However, those skilled in the art will appreciate that the utility of multi-layered memory bar designs might be limited by the extent to which the memory bar structure extends from the surface of the module substrate and, possibly, by the availability of unused pins or leads on the utilized IC packages, as it is the use of such pins or leads that allows for the selection of a particular IC circuit within a memory pair in the presently preferred embodiments.

While the invention is susceptible to various modifications and alternative forms, specific examples thereof have been shown in the drawings and are herein described in detail. It should be understood, however, that the invention is not to be limited to the particular forms or methods disclosed, but to the contrary, the invention is to cover all modifications, equivalents, and alternatives falling within the spirit and scope of the appended claims.

What is claimed is:

1. A memory density enhancement device comprising:
a substrate and a first integrated circuit package and a second integrated circuit package, said substrate having a first side and a second side and having a perimeter wall,
said first side having a first surface whereon a first plurality of land patterns are formed for connecting to a plurality of leads of said first integrated circuit chip package,
said second side having a second surface whereon a second plurality of land patterns are formed for connecting to a plurality of leads of said second integrated circuit chip package,
said perimeter wall defining a central cavity of sufficient size to allow passage there through of a body portion of said second integrated circuit chip package, and
said first integrated circuit package and said second integrated circuit package separated by a gap of substantially 10 mils.

2. The memory density enhancement device of claim 1, wherein selected land patterns of said first plurality of land patterns are electrically coupled to selected land patterns of said second plurality of land patterns.

3. The memory density enhancement device of claim 1, wherein said perimeter wall of said substrate has a thickness sufficient to insure that said substantially 10 mil gap is provided between a lower surface of said first integrated circuit chip package and an upper surface of said second integrated circuit chip package.

4. A memory density enhancement device comprising:
a substrate mounted on a surface of a memory module, said substrate having a perimeter wall defining a cavity and having a first set of contacts on a first side for connecting to a plurality of leads of a first integrated circuit package and a second set of contacts on a second side for connecting to a plurality of leads of a second integrated circuit package, said first integrated circuit package and said second integrated circuit package separated by a gap of substantially 10 mils.

5. A method for creating a high density memory module, said method comprising the steps of:
providing a printed circuit board for use in constructing said memory module,
providing a memory bar for use in constructing said memory module,
mounting two integrated circuit memory chips on said memory bar to form a populated memory bar, said integrated circuit memory chips separated by a gap of substantially 10 mils, and
mounting said populated memory bar onto said printed circuit board.

6. A method for creating a high density memory module, said method comprising the steps of:
providing a printed circuit board substrate,
providing a plurality of memory bar substrates, each memory bar substrate comprising a plurality of memory bar elements, and each memory bar element including a first plurality of contacts for connecting to a first integrated circuit chip package and a second plurality of contacts for connecting to a second integrated circuit chip package, said first and second plurality of contacts situated such that a gap of substantially 10 mils exists between said first and second integrated circuit chip packages,
populating said memory bar substrates by mounting respective pairs of integrated circuit chip packages to said respective memory bar elements comprising said memory bar substrates, and
mounting said populated memory bar substrates to respective sides of said printed circuit board substrate to form a memory module.

7. A method for creating a high density memory module, said method comprising the steps of:

assembling a plurality of integrated circuit memory chips on top of another within at least one support structure in a manner such that each of said plurality of integrated circuit memory chips can be independently selected while using a plurality of common input/output pads, said assembling step producing a memory bar structure, said integrated circuit memory chips separated by a gap of substantially 10 mils, and mounting said memory bar structure onto a pad provided upon a surface of a substrate for a memory module.

* * * * *

UNITED STATES PATENT AND TRADEMARK OFFICE
CERTIFICATE OF CORRECTION

PATENT NO.     : 6,295,220 B1
DATED          : September 25, 2001
INVENTOR(S)    : Darwish et al.

It is certified that error appears in the above-identified patent and that said Letters Patent is hereby corrected as shown below:

<u>Title page,</u>
Item [56], under References Cited, U.S. PATENT DOCUMENTS: please change "Wuk" to -- Wulc --.

<u>Column 2,</u>
Line 15, please change "72" to -- 72 --.

Signed and Sealed this

Ninth Day of July, 2002

*Attest:*

*Attesting Officer*

JAMES E. ROGAN
*Director of the United States Patent and Trademark Office*